(12) United States Patent
Cheng

(10) Patent No.: US 6,366,103 B1
(45) Date of Patent: Apr. 2, 2002

(54) MULTIPLE TEST PROBE SYSTEM

(76) Inventor: David Cheng, 711 Hibernia Ct., Sunnyvale, CA (US) 94087

( * ) Notice: Subject to any disclaimer, the term of this patent is extended or adjusted under 35 U.S.C. 154(b) by 0 days.

(21) Appl. No.: 09/348,751

(22) Filed: Jul. 6, 1999

(51) Int. Cl.[7] .......................... G01R 1/073; G01R 31/02
(52) U.S. Cl. ....................................... 324/754; 324/758
(58) Field of Search ................................ 324/754, 758, 324/158.1

(56) References Cited

U.S. PATENT DOCUMENTS

| | | | | |
|---|---|---|---|---|
| 1,367,285 A | * | 2/1921 | Stimmel ..................... 324/550 |
| 2,478,999 A | * | 8/1949 | Briseno ...................... 324/550 |
| 3,761,806 A | * | 9/1973 | Napor et al. ................ 324/658 |
| 5,099,199 A | * | 3/1992 | Carter ......................... 324/550 |

* cited by examiner

*Primary Examiner*—Ernest Karlsen
(74) *Attorney, Agent, or Firm*—Oppenheimer Wolff & Donnelly LLP

(57) ABSTRACT

A multiple test probe system is disclosed. The multiple test probe system includes a support and a mount pivotally coupled to the support. The mount is capable of pivoting to a number of testing positions. A number of probe assemblies are coupled to the mount and associated with a corresponding number of testing positions. The probe assemblies include a number of electrical contacts coupled to a number of wires in a probe bus regardless of a testing position of the mount. The multiple test probe system further includes an actuator coupled to the mount to cause the mount to move between the testing positions.

7 Claims, 6 Drawing Sheets

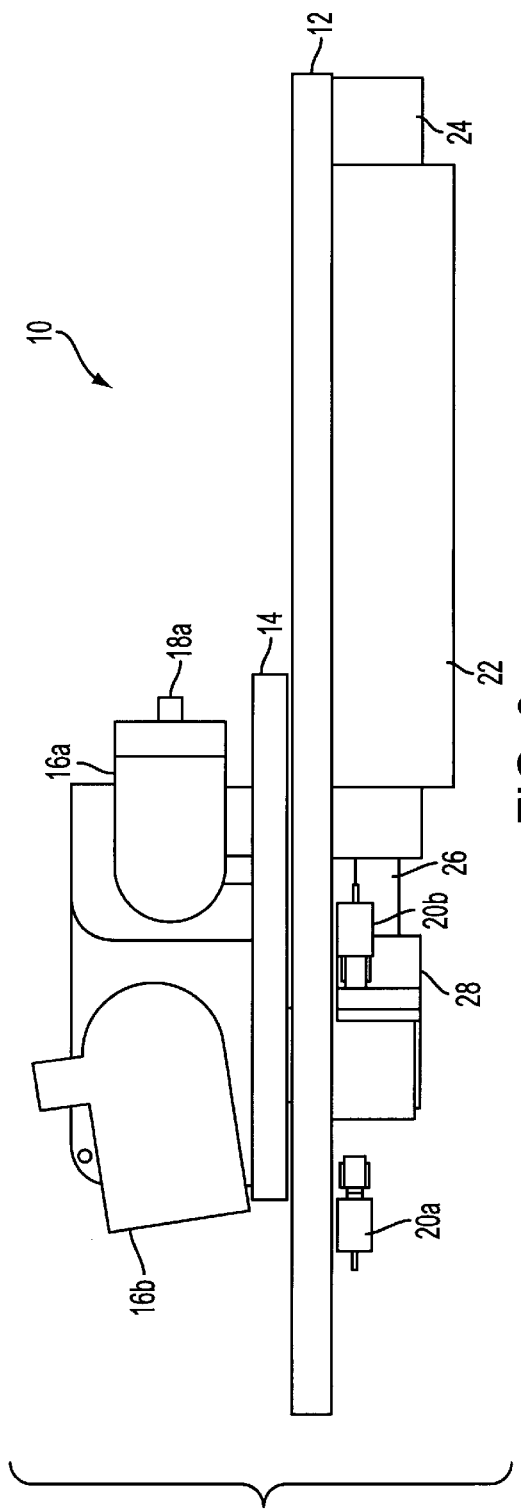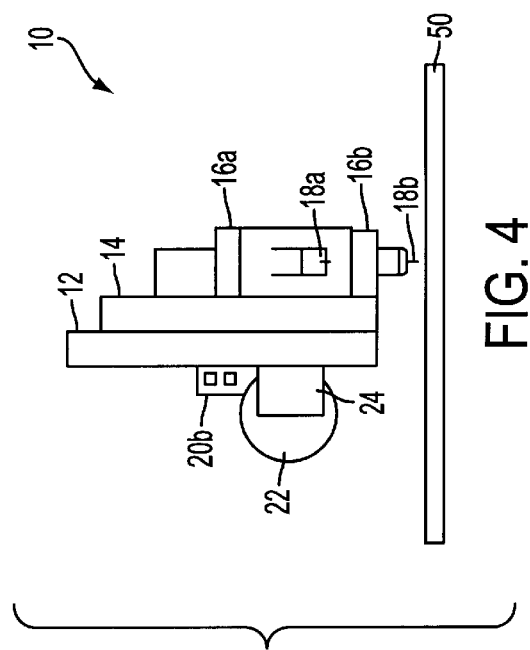

MULTIPLE TEST PROBE SYSTEM

BACKGROUND OF THE INVENTION

The present invention relates to electronic testing systems, and more particularly to test probes for electronic testing systems.

The testing of samples is performed widely in the manufacture of products. For example, the manufacture and fabrication of integrated circuits begin with blank, unpatterned semiconductor wafers. These wafers undergo a number of critical testing steps before being processed and formed into the final integrated circuit form. For example, sheet resistance and wafer (substrate) thickness may be tested in the manufacturing process so that the bulk resistivity of a wafer can be determined.

Testing of sheet resistance, substrate thickness and other characteristics of a semiconductor wafer is often done using a probe assembly having a number of electrical contacts or pins capable of directing a constant current (I) through the film and reading the voltage drop (V) created across the film by the current. Sheet resistance may then be determined by Ohm's law (R=K(V/I)), after which the thickness of the substrate may be calculated using the sheet resistance and the known bulk resistivity ($\rho$) of the film. The constant K is determined by the geometry of the probes in the specific configuration.

Because semiconductor wafers are manufactured from many types of materials, each of which exhibit specific characteristics, a different type of probe assembly may be required for a particular application. For example, probe assemblies with sharper pins (i.e. types "A" or "B" probes) are used for metal film. The sharp pin is utilized because it is able to push into the metal for good contact. On the other hand, probe assemblies with duller pins (i.e. types "C" or "D" probes) are used, for example, for doped silicon applications. Using a dull pin to contact silicon reduces the chance of puncturing the surface of the wafer. Other applications of semiconductor testing require probe assemblies that vary the spacing between the pins and electrical contacts or probe assemblies that apply a different force to the wafer surface (e.g. a spring-loaded pin).

In the prior art, probe assemblies were changed every time a different type of probe was required by a specific application (for example, changing from a type A to a type C probe). Probes were also changed for different applications because of the danger of contamination.

The conventional method of changing probe assemblies is to change it by hand. One problem with associated with this technique is that it increases the risk of error during the operation of the probe assembly. Removal of a probe assembly results in unnecessary wear and tear, which could lead to errors in measurement. Contamination and damage of the delicate probe is also a risk.

Yet another problem inherent in the replacement of a probe test head by hand is that the electrical connection between the probe assembly and the microprocessor controller of the electronic testing system must be broken, therefore increasing the risk for error if the probe assembly is not properly replaced. In addition, the procedure for manually changing probe test heads is impractical. For example, in an automated wafer handling system, each wafer is loaded onto the measurement equipment from a wafer cassette using robotics. Therefore, operators would need to halt the operation of the wafer testing system each time a probe test head needs to be changed.

Because it takes several minutes to manually changing probe test heads, if such a change is needed, it takes much longer to test each individual wafer, decreasing the overall efficiency of the wafer testing system. The changing of probe assemblies is so inconvenient and time consuming that multiple wafer testing systems are often used at considerable additional expense to solve the problem, with each wafer testing system having a different probe assembly.

Despite the development of semiconductor technology and the importance of testing wafers accurately and efficiently, a convenient and reliable method and apparatus for changing test probe assemblies remain elusive. In view of the foregoing, what is needed is an efficient method and apparatus for changing probe assemblies for electronic testing systems.

SUMMARY OF THE INVENTION

The present invention fills this need by providing a method and apparatus for changing probe assemblies. Several inventive embodiments of the present invention are described below.

In one embodiment of the present invention, a multiple test probe system is disclosed. The multiple test probe system includes a support, and a mount pivotally coupled to the support. The mount is capable of pivoting to a number of testing positions. A number of probe assemblies are coupled to the mount and associated with a corresponding number of testing positions. The probe assemblies include a number of electrical contacts coupled to a number of wires in a probe bus regardless of a testing position of the mount. The multiple test probe system further includes an actuator coupled to the mount to cause the mount to move between the testing positions.

In another embodiment of the present invention, a method for providing a number of electrical probe assemblies is disclosed. The method includes providing a number of test probe assemblies arranged such that only one of the probe assemblies can be in a testing position at one time. A desired probe assembly is determined, and then moved to the testing position if it is not already in position. The desired probe assembly is then engaged with a sample to be tested. Testing signals are then provided to all of the probe assemblies, such that test result signals are received only from the desired probe assembly due to its engagement with the sample.

In another embodiment of the present invention, a multiple test probe system is disclosed. The multiple test probe system includes a support and a mount pivotally coupled to the support. The mount is capable of pivoting to a number of testing positions. A number of probe assemblies is coupled to the mount and associated with a number of testing positions. The multiple test probe system further includes a linear actuator coupled between the support and the mount to cause the mount to move between the testing positions.

One advantage of the present invention is that it allows a multiple probe system to efficiently change probe assemblies for different applications. The present invention eliminates the need to change probe assemblies by hand and further eliminates the need to dedicate more than one multiple probe system to different applications that require different types of probe assemblies. Another advantage of the present invention is that it reduces the chance of both wear and error because the electrical contacts of the probe assemblies are coupled to the probe bus regardless of the position of the mount.

These and other advantages of the present invention will become apparent to those skilled in the art upon reading the following detailed description of the invention and studying the accompanying drawings.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 3 illustrates a top elevational view of the multiple probe system in accordance with one embodiment of the present invention.

FIG. 4 illustrates a side elevational view of the multiple probe system in accordance with one embodiment of the present invention.

DETAILED DESCRIPTION OF THE PREFERRED EMBODIMENTS

A method and apparatus for efficiently changing probe test heads that contact a substrate is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
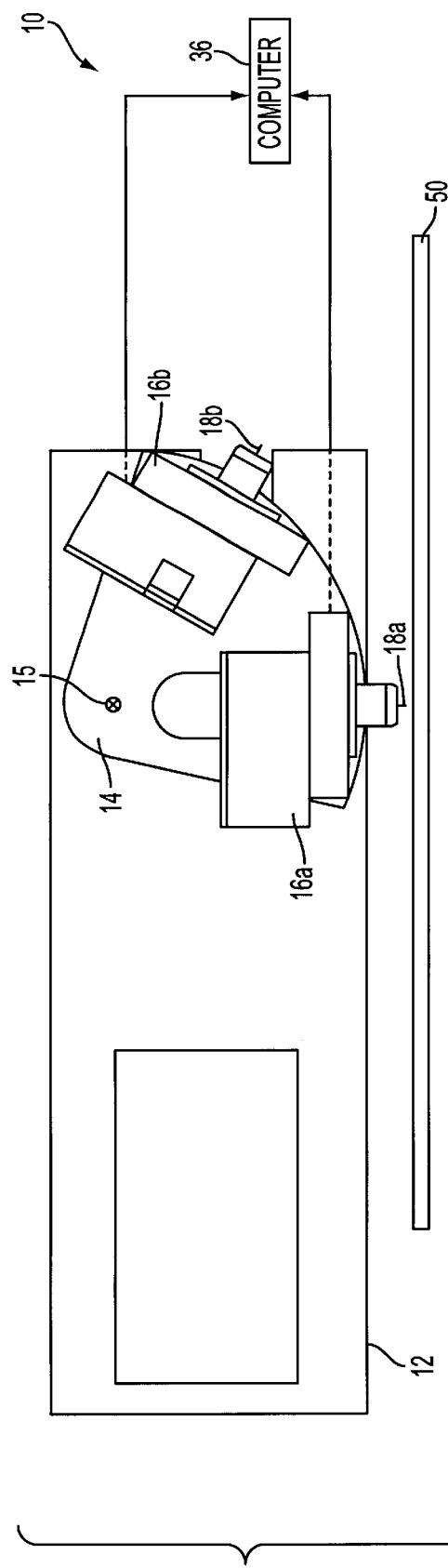
FIG. 1A illustrates a front elevational view of a multiple probe system in accordance with one embodiment of the present invention.

FIG. 1A illustrates a front elevational view of a multiple probe system 10 in accordance with one embodiment of the present invention. Multiple probe system 10 includes a support 12 to which a mount 14 is pivotally coupled by a pivot pin 15. Probe assemblies 16a and 16b, each having a set of electrical contacts 18a and 18b, respectively, are coupled to mount 14. Probe assemblies 16a and 16b are also coupled to a computer 36 that is configured to send and receive test signals to the probe assemblies 16a and 16b.

Probe assembly 16a is shown in a testing position with electrical contacts 18a ready to contact a semiconductor wafer 50. For ease of illustration, only two probe assemblies 16a and 16b are shown, but as those skilled in the art will appreciate, additional probe assemblies may be coupled to mount 14 for certain applications. Each set of electrical contacts 18a and 18b may have a varying number of actual electrical contacts, such as in a four-point probe assembly.

Figure 1B:
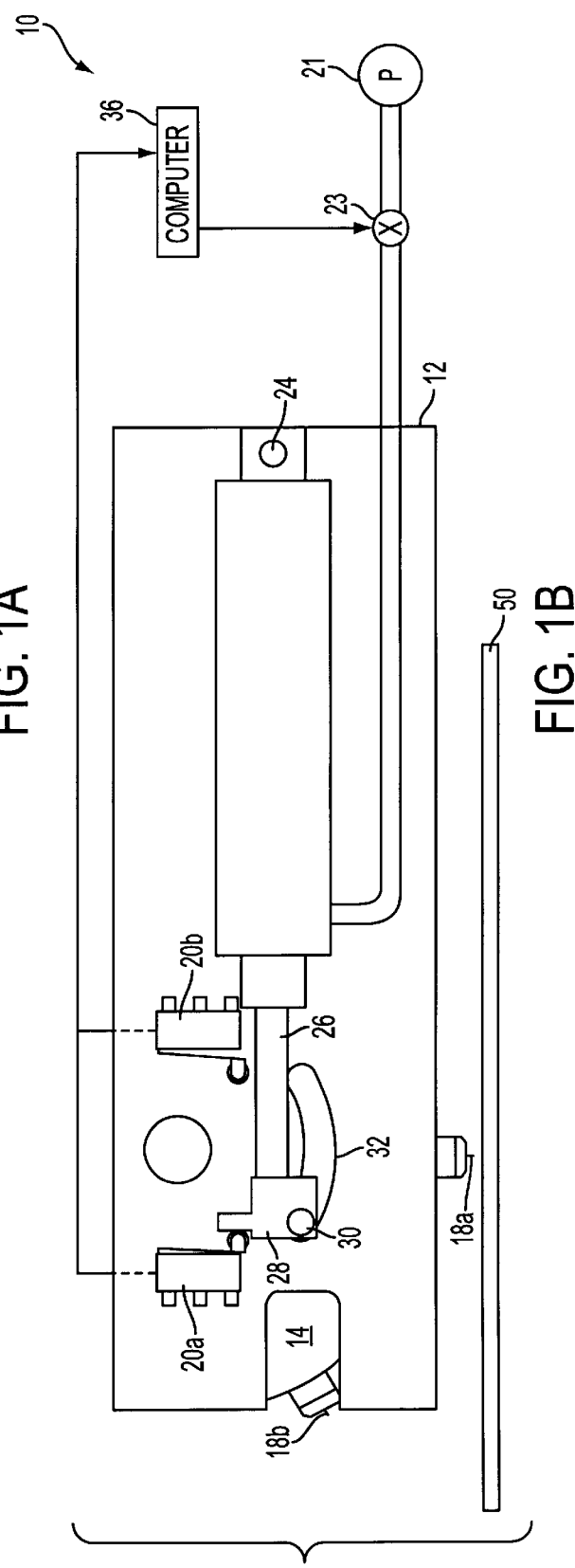
FIG. 1B illustrates a rear elevational view of the multiple probe system in accordance with one embodiment of the present invention.

FIG. 1B illustrates a rear elevational view of multiple probe system 10 in accordance with one embodiment of the present invention. Probe assembly 16a is shown in a testing position, with electrical contacts 18a ready to contact semiconductor wafer 50. Multiple probe system 10 further includes a number of position sensors 20a and 20b coupled to support 12. An actuator 22 having a shaft 26 and a shaft cam 28 is pivotally coupled to support 12 by a pivot 24. Linear actuator 22 may be coupled to a compressed gas or liquid source 21 through a valve 23. Shaft cam 28 includes a pin 30, which is coupled to mount 14, as shown in FIG. 1A, through support 12 using a slot 32.

Position sensors 20a and 20b are preferably microswitches mounted at a contact position on support 12. The microswitches send a contact signal to computer 36 based on a physical contact with the microswitch or another position sensor. For example, if shaft cam 28 contacts the position sensor 20a, then position sensor 20a will send a contact signal to computer 36 indicating that probe assembly 16a is in testing position as shown in FIG. 1A and 1B. For ease of illustration, only two position sensors 20a and 20b are shown, however, additional position sensors 20 may be used in other embodiments of the invention.

Actuator 22 is shown as a linear actuator (e.g. a pneumatic or hydraulic dual action piston), however, other types of actuators such as a stepper motor may be used. The flow of gas or liquid into and out of linear actuator 22 may be controlled by a valve 23 to move shaft 26 and shaft cam 28 along a slot 32. Valve 23 is preferably controlled by computer 36 based upon the position of the probe assemblies 16a and 16b as detected by position sensors 20a and 20b. Slot 32 is may be a curved shape to allow actuator 22 to operate linearly by pivoting at pivot 24.

Figure 2A:
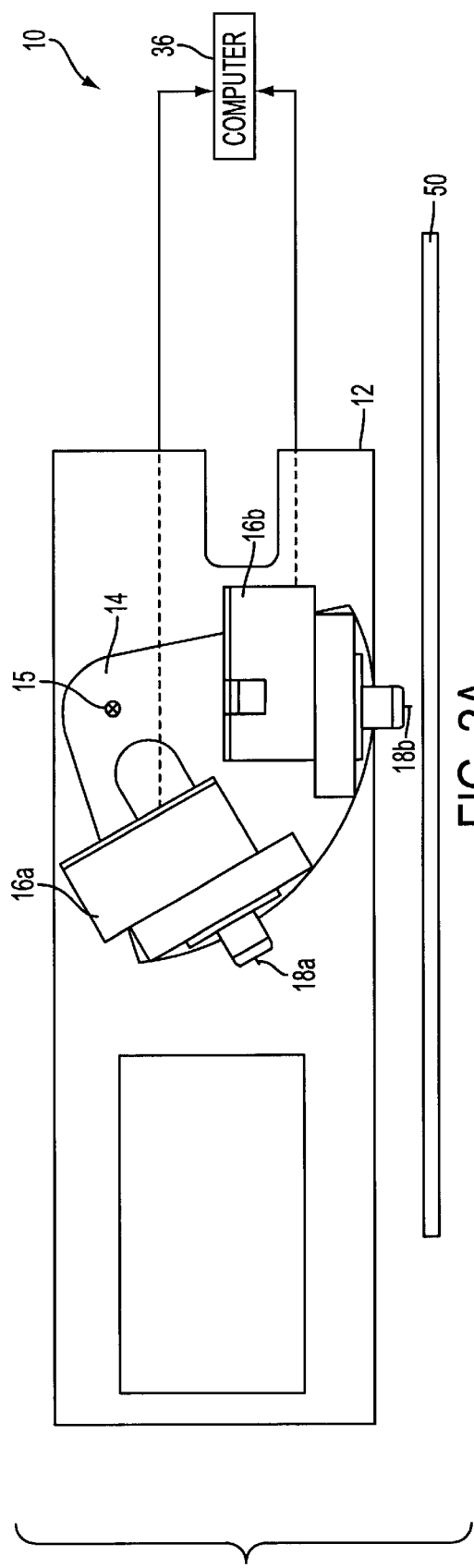
FIGS. 2A and 2B are the views illustrated by FIGS. 1A and 1B after the probe assemblies have been rotated.
Figure 2B:
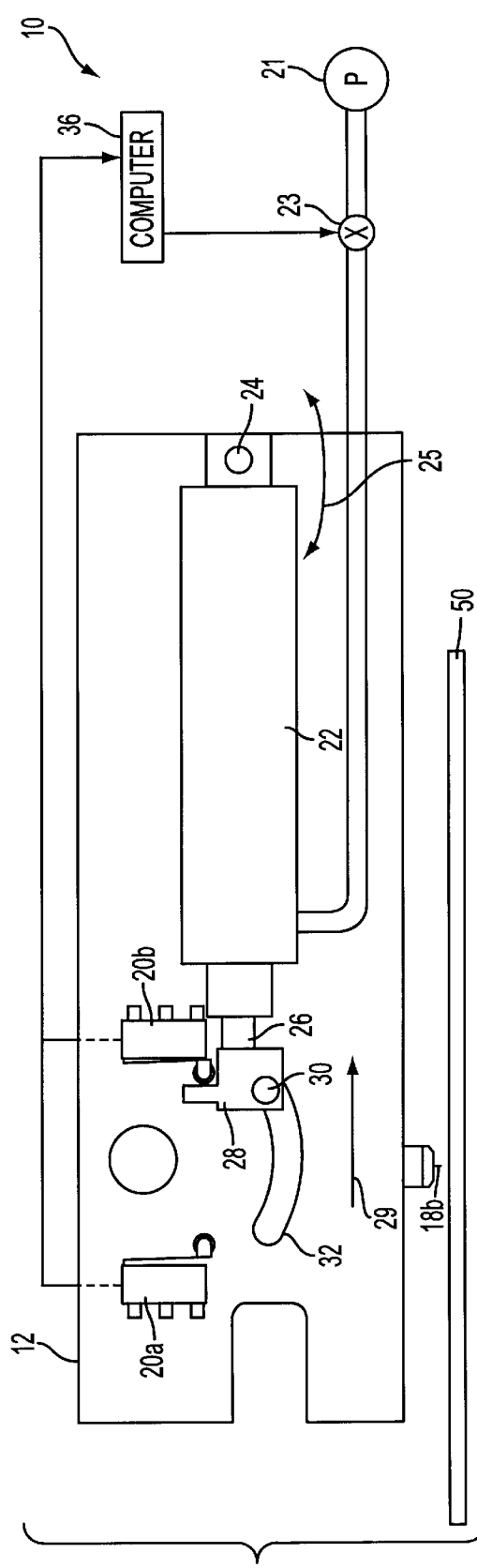

FIGS. 2A and 2B are the views illustrated by FIGS. 1A and 1B after the probe assemblies 16a and 16b have been rotated. If probe assembly 16b is needed for a particular application, computer 36 directs actuator 22 by controlling valve 23. Actuator 22 then moves shaft 26, thereby moving shaft cam 28 as shown by an arrow 29. From the motion of shaft cam 28, pin 30 is pushed along slot 32, thereby rotating mount 14 around pivot pin 15 to place probe assembly 16b in a testing position. At the same time, actuator 22 pivots relative to support 12 at pivot 24 as shown by an arrow 25. Shaft 26 continues movement until shaft cam 28 contacts and activates position sensor 20b. Position sensor 20b then sends a contact signal to computer 36, indicating that probe assembly 16b is in a testing position. Computer 36 then directs actuator 22 to stop moving shaft 26.

If probe assembly 16a is needed to test an application, computer 36 directs actuator 22 to move probe assembly 16a to a testing position by moving shaft 26 and shaft cam 28 in the opposite direction shown by arrow 29. In the same manner as described above, pin 30 is pushed along slot 32, thereby rotating mount 14 around pivot pin 15 to place probe assembly 16a in a testing position. At the same time, actuator 22 pivots relative to support 12 at pivot 24 as shown by arrow 25. When shaft cam 28 contacts position sensor 20b, a contact signal to computer 36, indicating that probe assembly 16a is in a testing position as illustrated in FIGS. 1A and 1B. Computer 36 then directs actuator 22 to stop moving shaft 26.

FIG. 3 illustrates a top elevational view of multiple probe system 10 in accordance with one embodiment of the present invention. As with FIGS. 2A and 2B, probe assembly 16b is shown in testing position. Therefore, shaft cam 28 is in contact with position sensor 20b.

FIG. 4 illustrates a side elevational view of multiple probe system 10 in accordance with one embodiment of the present invention. As with FIGS. 2A, 2B, and 3, probe assembly 16b is shown in testing position with electrical contact 18b in position to contact and test wafer 50.

Figure 5A:
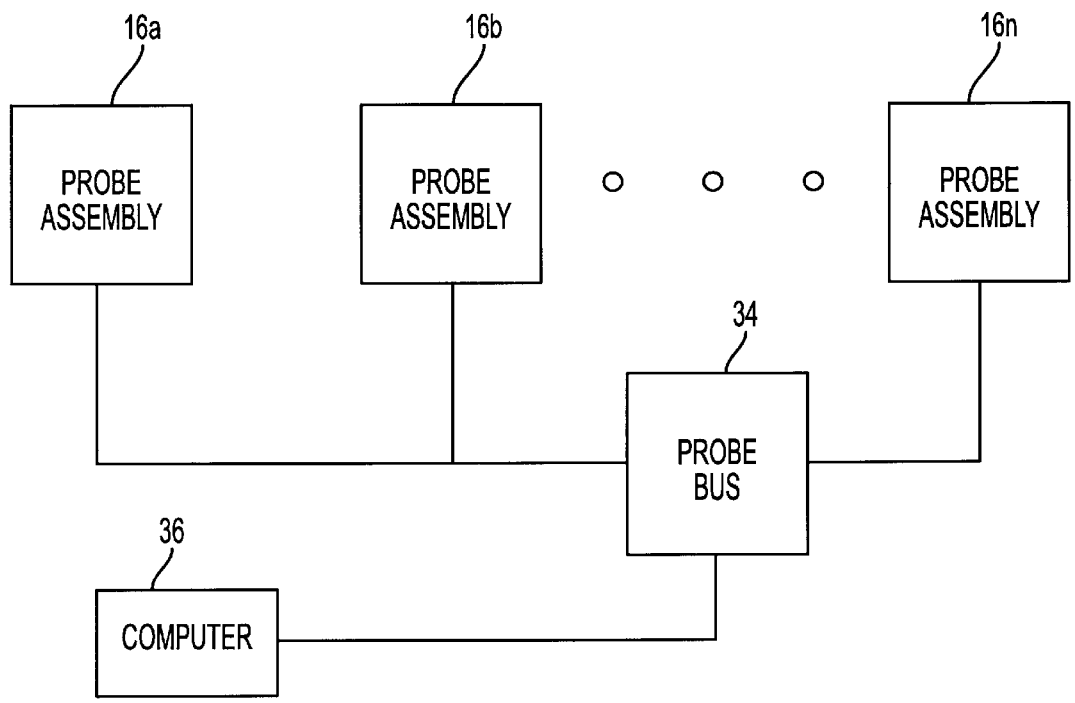
FIG. 5A is a block diagram of the wiring of the probe assemblies to a the probe bus in accordance with one embodiment of the present invention.

FIG. 5A is a block diagram of the wiring of probe assemblies 16a–n to a probe bus 34 in accordance with one embodiment of the present invention. It is in this manner that each probe assembly 16 is coupled to probe bus 34 regardless of a testing position of the other probe assemblies 16. Probe assemblies 16a–n are preferably coupled to probe bus 34 in parallel. By "in parallel" it is meant that probe assemblies 16a–n are continuously coupled to a common bus, and not that there is a pin for pin parallelism between probe assemblies 16a–n. Probe bus 34 is then coupled to computer 36.

Figure 5B:
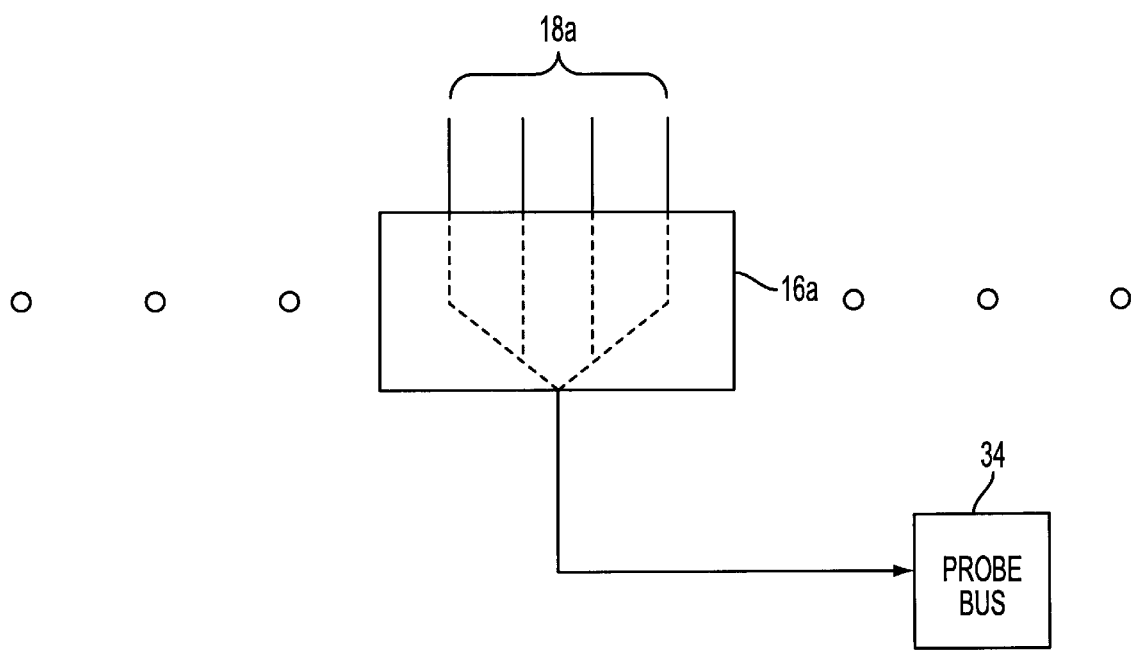
FIG. 5B is a detailed illustration of a probe assembly in accordance with one embodiment of the present invention.

FIG. 5B is a detailed illustration of a probe assembly 16 in accordance with one embodiment of the present invention. For exemplary purposes, probe assembly 16 is coupled to four electrical contacts 18 in parallel. Only the specific set of electrical contacts 18 that is in contact with semiconductor wafer 50 will make the electrical connection. For example, if probe assembly 16a is in testing position, then electrical contacts 18a will make the electrical connection while all other sets of electrical contacts 18b–n remain idle. Therefore, there is no need to switch circuits for the wiring, although it may be desirable to switch circuits in other applications.

Figure 6:
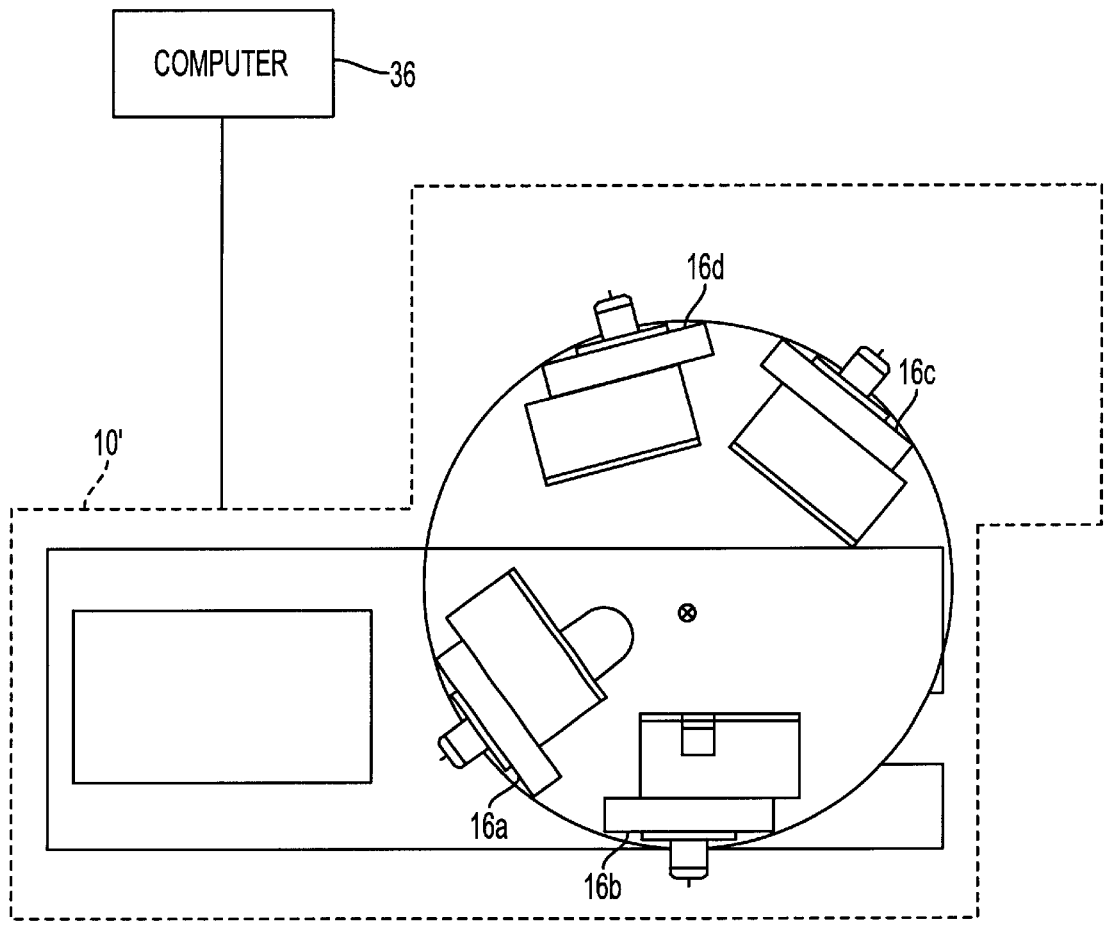
FIG. 6 illustrates a microprocessor or a computer connected to multiple probe system in accordance with one embodiment of the present invention.

FIG. 6 illustrates a microprocessor or computer 36 connected to multiple probe system 10' in accordance with one embodiment of the present invention. Multiple probe system 10' is shown including additional probe assemblies 16c and 16d to exemplify how additional probe assemblies may be incorporated into the present invention. Computer 36 may be used to control the operation of multiple probe system 10' by determining the position of probe assemblies 16 through signals received from position sensors 20. Computer 36 may then move probe assemblies 16 into testing position with actuator 22 as required by the specific application.

Figure 7:
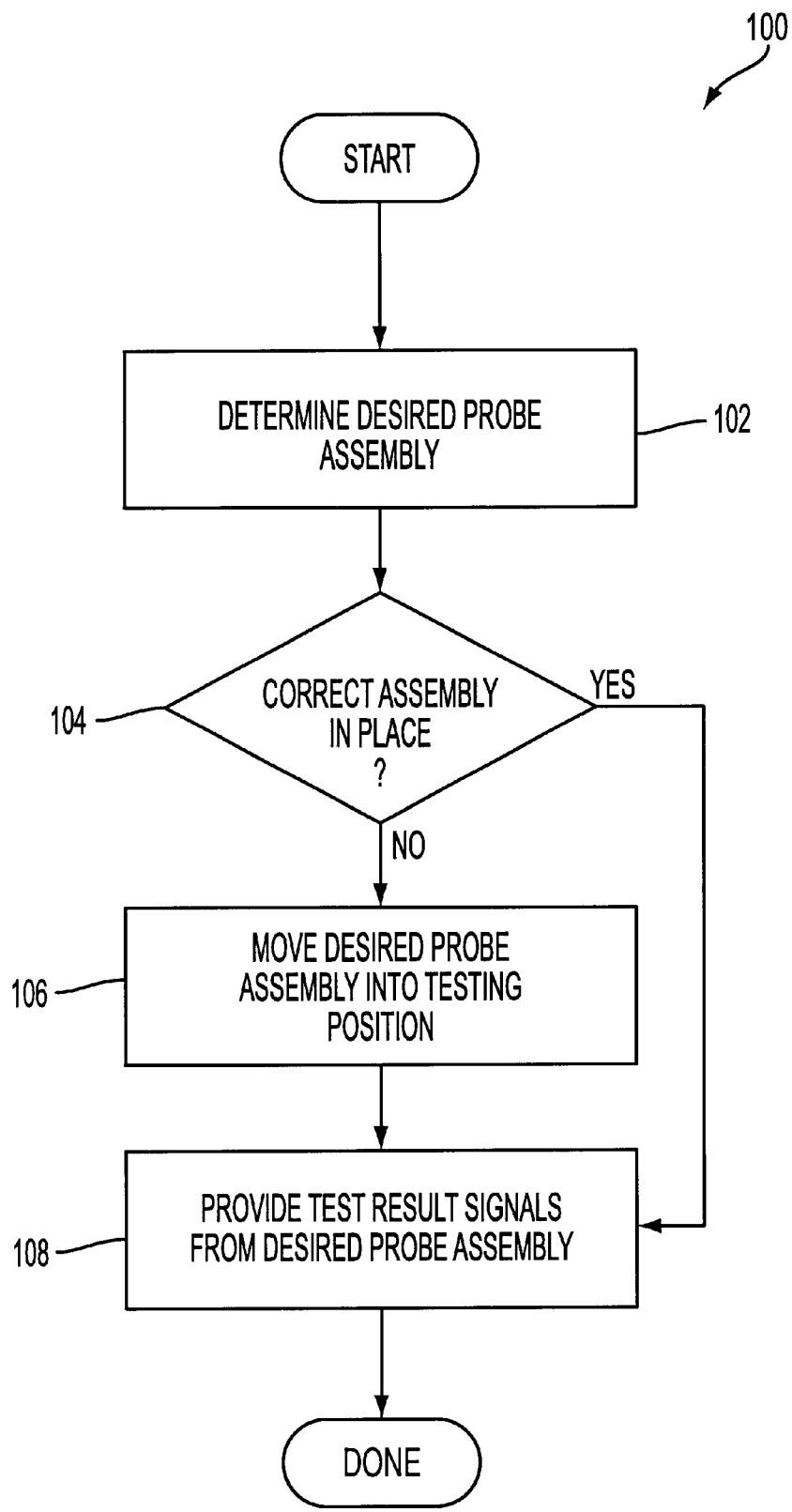
FIG. 7 is a flow chart illustrated a method of determining and changing to a desired probe assembly in accordance with one embodiment of the present invention.

FIG. 7 is a flow chart illustrating a method 100 of determining and changing to a desired probe assembly in accordance with one embodiment of the present invention. Method 100 begins with an act 102 that determines a desired probe assembly. The desired probe assembly is typically determined by the wafer type and the wafer characteristic to be measured. For example, probe assemblies with sharper electrical contacts or pins (such as type A) are used for metal film measurements, while probe assemblies with duller pins (such as type C) are used for doped silicon applications.

In an act 104, a decision is made as to whether the correct probe assembly is in place. If the desired probe assembly as determined by act 102 is already in testing position as detected by the appropriate position sensor, then method 100 proceeds to an act 108 (discussed below). If the correct probe assembly is not already in place, then method 100 proceeds to an act 106 that moves the desired probe assembly into testing position. An actuator rotates a mount supporting the probe assemblies until the correct probe assembly is in testing position as detected by the appropriate position sensor. Method 100 then proceeds to an act 108 in which test result signals containing for example, information about the resistivity and thickness of the wafer, are provided from the desired probe assembly to a computer.

In summary, the present invention provides a multiple test probe system for changing probe assemblies for different applications. The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A multiple test probe system comprising:

a support;

a probe bus comprising a plurality of wires;

a mount pivotally coupled to said support and capable of pivoting to a plurality of testing positions;

a plurality of probe assemblies coupled to said mount and associated with said plurality of testing positions, wherein each of said probe assemblies include a plurality of electrical contacts coupled to said plurality of wires of said probe bus regardless of a testing position of said mount;

an actuator coupled to said mount to cause said mount to move between said plurality of testing positions; and a first position sensor mounted at a contact position on said support, wherein said first position sensor is activated to verify when one of said plurality of probe assemblies is in said testing position.

2. A multiple test probe system as recited in claim 1, further comprising a second position sensor mounted at a second contact position on said support, wherein said second position sensor is activated to verify when another of said plurality of probe assemblies is in said testing position.

3. A multiple test probe system as recited in claim 2, wherein said first and second position sensors are microswitches.

4. A multiple test probe system as recited in claim 1, wherein each of said plurality of probe assemblies includes four electrical contacts.

5. A multiple test probe system as recited in claim 1, wherein said electrical contacts are coupled to said probe bus in parallel.

6. A multiple test probe system as recited in claim 1, wherein said actuator is a stepper motor system.

7. A multiple test probe system as recited in claim 6, wherein said stepper motor system is controlled by a microprocessor.

* * * * *